United States Patent [19]

Frei et al.

[11] Patent Number: 5,406,034
[45] Date of Patent: Apr. 11, 1995

[54] CIRCUIT BOARD HAVING STEPPED VIAS

[75] Inventors: John K. Frei, Mesa; Howard D. Knuth, Tempe; Bruce R. Tegge, Scottsdale, all of Ariz.

[73] Assignee: Motorola, Inc., Schaumburg, Ill.

[21] Appl. No.: 279,314

[22] Filed: Jul. 22, 1994

Related U.S. Application Data

[63] Continuation of Ser. No. 993,846, Dec. 21, 1992, abandoned.

[51] Int. Cl.⁶ .............................................. H05K 1/14
[52] U.S. Cl. .............................. 174/266; 174/262
[58] Field of Search ............ 174/261, 262, 263, 250, 174/253, 260, 266; 361/778

[56] References Cited

U.S. PATENT DOCUMENTS

| | | | |
|---|---|---|---|
| 3,348,990 | 10/1967 | Zimmerman et al. | |
| 3,876,822 | 4/1975 | Davy et al. | 174/266 |
| 4,017,968 | 4/1977 | Weglin | 174/266 X |
| 4,245,273 | 1/1981 | Feinberg et al. | 361/382 |
| 4,254,445 | 3/1981 | Ho | 361/392 |
| 4,521,449 | 6/1985 | Arnold et al. | 427/96 |
| 4,551,788 | 11/1985 | Daniel et al. | 361/403 |
| 4,729,061 | 3/1988 | Brown | 174/266 X |
| 4,801,489 | 1/1989 | Nakagawa | 174/266 X |
| 4,858,819 | 8/1989 | Hill et al. | 228/179 |
| 5,050,295 | 9/1991 | Sullivan et al. | 174/266 X |
| 5,091,825 | 2/1992 | Hill et al. | 361/404 |
| 5,120,678 | 6/1992 | Moore et al. | 437/183 |
| 5,129,142 | 7/1992 | Bindra et al. | 174/263 X |

*Primary Examiner*—Leo P. Picard
*Assistant Examiner*—L. Thomas
*Attorney, Agent, or Firm*—Gregory J. Gorrie; Robert M. Handy

[57] ABSTRACT

A stepped via is formed in a circuit board. Large holes are punched in a predetermined pattern in two insulating sheets and small holes are punched in the same pattern in another insulating sheet. The holes are dimensioned so that their diameters are larger than the thicknesses of their respective sheets. However, the diameters of the larger holes are less than the combined thickness of all sheets. The sheets are juxtaposed so that the sheet with the smaller holes is between the other sheets and corresponding holes from the respective sheets are aligned. The sheets are pressed together to form an integral substrate. Metallization is applied from one side of the substrate, then metallization is applied to the substrate from the other side.

16 Claims, 4 Drawing Sheets

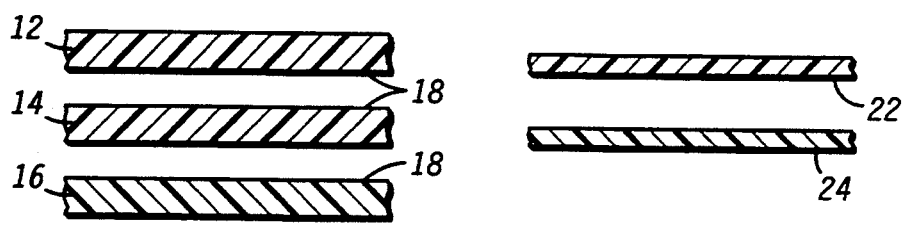
FIG. 1
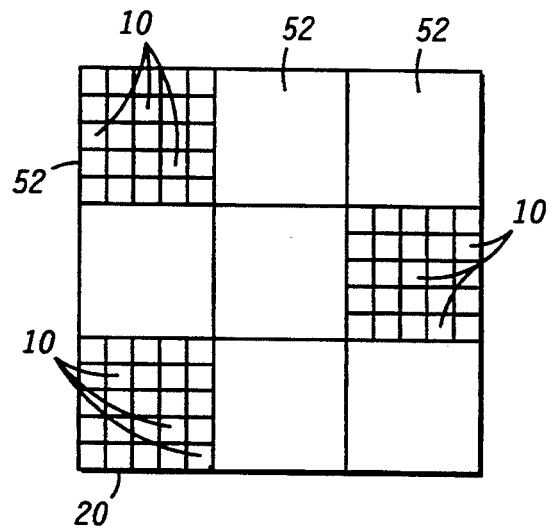
FIG. 2
FIG. 3
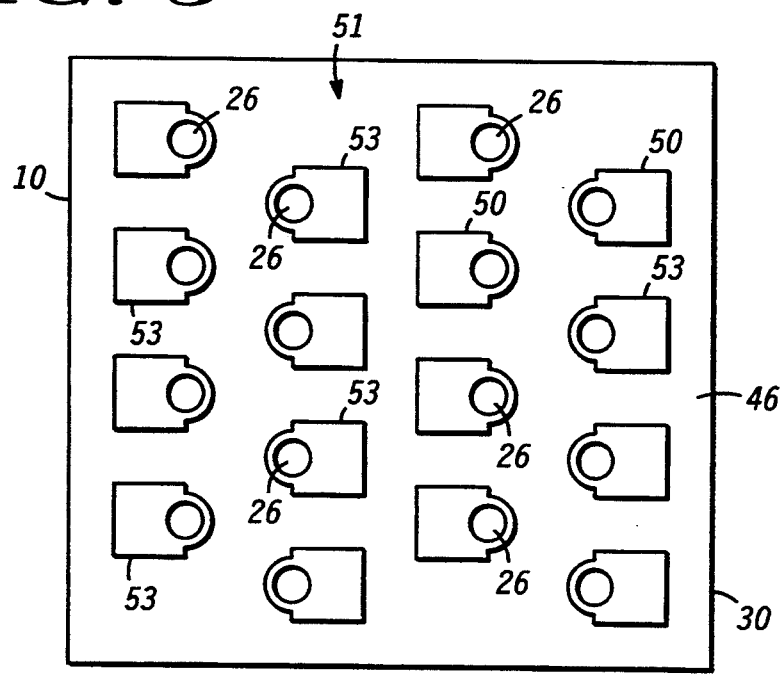

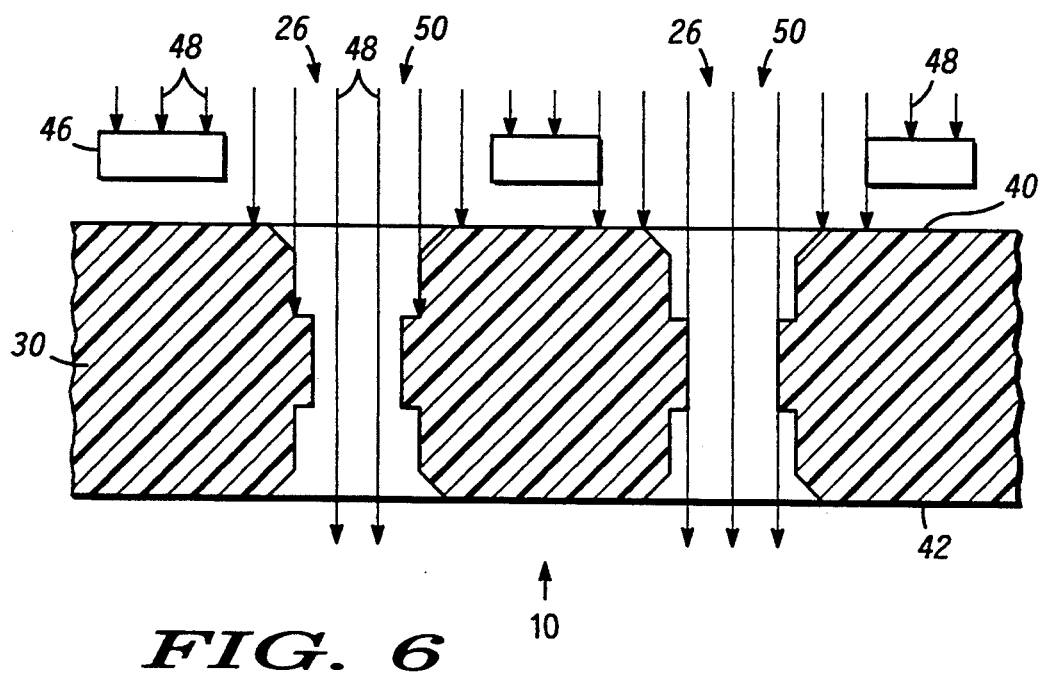
FIG. 6
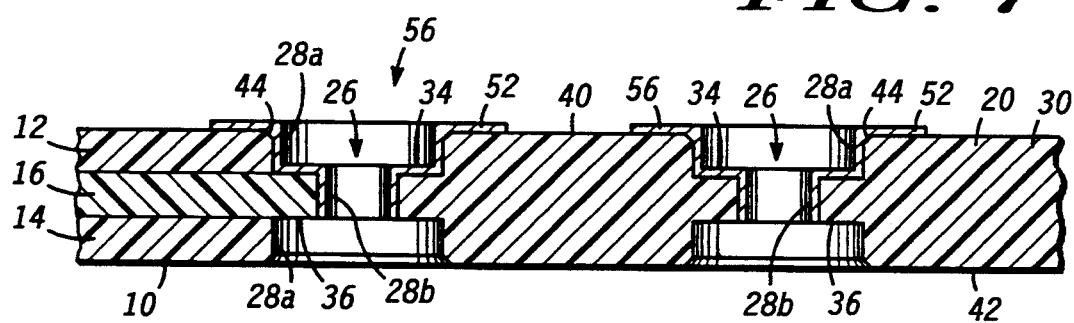
FIG. 7
FIG. 8
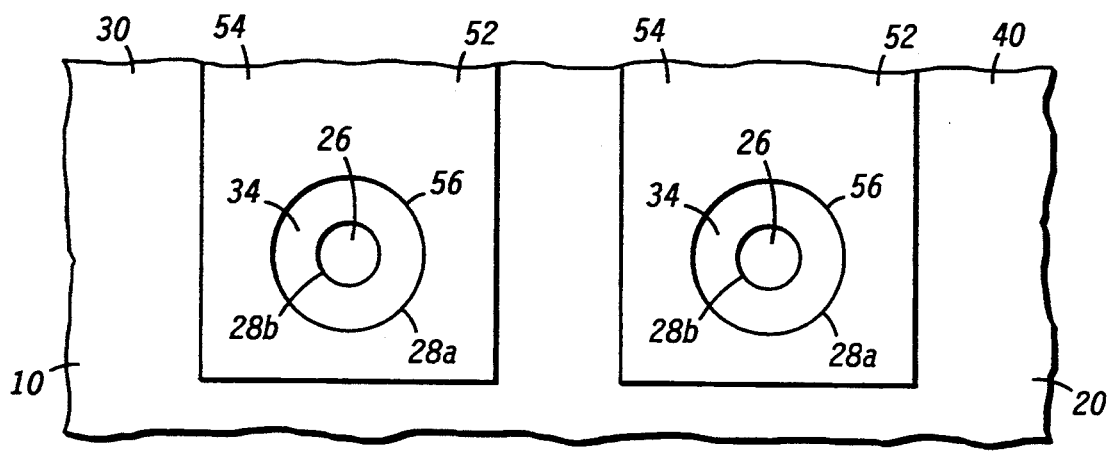

CIRCUIT BOARD HAVING STEPPED VIAS

This application is a continuation of prior application Ser. No. 07/993,846, filed Dec. 21, 1992, now abandoned.

TECHNICAL FIELD OF THE INVENTION

The present invention relates generally to electrical circuits and a method therefor. More specifically, the present invention relates to means and methods for electrical circuits having conductive paths between surfaces of a substrate.

BACKGROUND OF THE INVENTION

Electrical circuit designers often face the problem of needing to implement electrical circuits using as little space as is practical. Three-dimensional circuit implementations help in miniaturizing circuit area. In three-dimensional circuits, interconnections between components are routed in at least two planes, where the planes are spaced apart and insulated from one other.

While significant space savings can be achieved in a three-dimensional circuit, provisions must be made to accommodate the routing of conductors from one plane to another. Typically, conductors are routed from one plane to another by a feedthrough or "via". A conventional via is made by forming a hole or "barrel", through a substrate between opposing sides of the substrate, applying a conductive material to the barrel (i.e. the substrate walls surrounding the interior of the hole), and connecting the conductive material to conductors formed on the opposing substrate sides. Many processes are known for forming holes, including punching, drilling, and etching. Likewise, many processes, including screen printing, plating, evaporation deposition, and sputter deposition, are known for applying a conductive material to barrels and for forming conductors on opposing substrate surfaces.

However, conventional vias often consume an undesirably large amount of space. Regardless of the particular hole metallization process selected, an aspect ratio parameter limits the minimum amount of surface area which is dedicated to a via on the opposing sides of the substrate. The aspect ratio is calculated by dividing the thickness of the substrate, e.g., length of the via's barrel, by the diameter of the via's barrel. As a rule of thumb, a reliable via requires an aspect ratio of 1:1 or less.

Larger via diameters generate lower aspect ratios, but larger via diameters consume greater amounts of substrate surface area. When a substrate includes several vias, and each via is surrounded by a conductive land area to insure contact with surface traces, much of the substrate's overall area is dedicated only to vias. Of course, a low via aspect ratio may be obtained by narrowing the substrate. However, substrates which are too thin are often not acceptable because of a increased risk of breaking.

If a via is attempted with an aspect ratio greater than 1:1, the via often ends up without uniform metallization throughout the via. Corners and the center of the barrel, between the opposing sides of the substrate, often receive inadequate coverage. When non-uniform coverage occurs, opens may form after several temperature cycles, plating processes may not be successful, and etching processes may form voids in the metallization. Moreover, at an aspect ratio of greater than 1:1, inspection becomes virtually impossible because insufficient viewing angles and illumination are present for the center of the barrel. Consequently, the same via geometries which reduce the chances of obtaining reliable vias prevent inspections from detecting whether resulting vias are in fact acceptable.

SUMMARY OF THE INVENTION

Accordingly, it is an advantage of the present invention that an improved circuit board with electrical continuity between surfaces is provided.

Another advantage of the present invention is that a stepped via which forms a reliable feedthrough at an combined aspect ratio greater than 1:1 is provided.

Another advantage is that the present invention provides an inspectable via at a combined aspect ratio of greater than 1:1.

Another advantage is that the present invention provides a method of forming a stepped via.

Yet another advantage is that the present invention permits the use of thick film via metallization processes, such as screen printing, in connection with via diameters and substrate thicknesses in the one to fifteen mil range.

The above and other advantages of the present invention are carried out in one form by a circuit board with electrical continuity between surfaces. The circuit board includes a first insulating substrate layer having a first hole extending therethrough. A second insulating substrate layer has a second hole extending therethrough. The second hole has a smaller cross sectional area than the first hole. The first layer is juxtaposed with the second layer so that said first and second holes are substantially aligned. A conductive material extends through the first and second holes.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 1 shows a cross sectional side view of various layers of materials utilized in connection with a circuit board after a first stage in the formation of the circuit board;

FIG. 2 shows a top view of an exemplary array of circuit boards formed in accordance with the teaching of the present invention;

FIG. 3 shows a bottom view of an exemplary form of a single circuit board from the array depicted in FIG. 2;

FIG. 6 shows a cross sectional side view of a portion of the circuit board at a fourth stage;

FIG. 7 shows a cross sectional side view of a portion of the circuit board after the fourth stage;

FIG. 8 shows a partial top view of the circuit board after the fourth stage;

Figure 4:
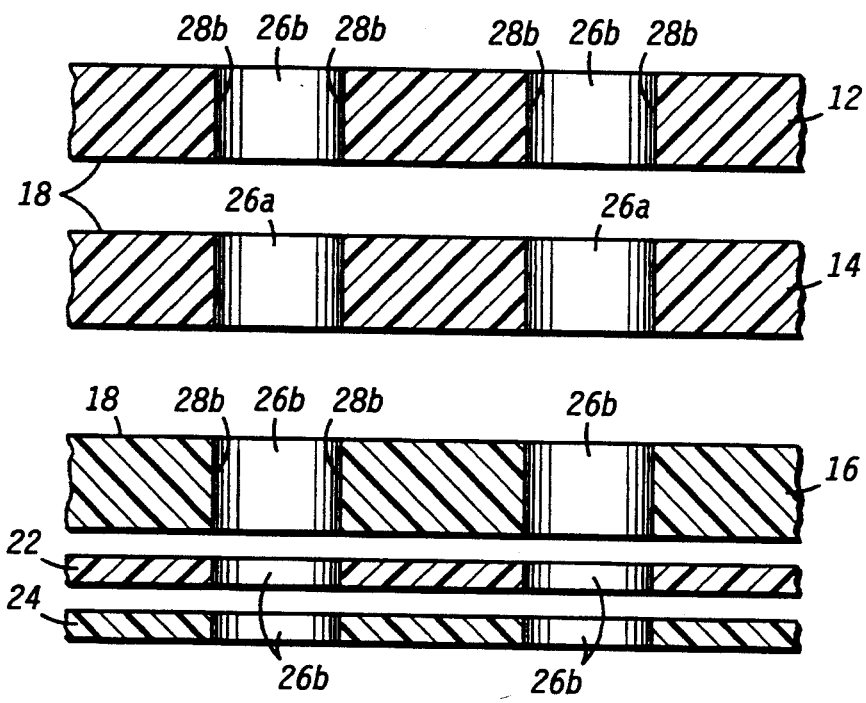
FIG. 4 shows a cross sectional side view of a portion of the various layers after a second stage.

In the following description of preferred embodiments, certain items are similar to other items. This description distinguishes such items from their counterparts by the use of the lower case alphabetic characters "a" and "b" which are appended to a common reference number. When an alphabetic character is omitted, the description refers to any one of such items and their counterparts individually or to all of them collectively.

DETAILED DESCRIPTION OF THE PREFERRED EMBODIMENTS

FIG. 1 depicts a first stage in a process for forming a circuit board 10. FIG. 1 shows a cross sectional side view of sheets, or layers, 12, 14, and 16 of an insulating material 18. In subsequent stages, sheets 12, 14, and 16 are laminated together into an integral substrate for circuit board 10. While the presently preferred embodiment of the present invention uses three sheets of material 18, nothing prevents the use of only two sheets or of more than three sheets. In the preferred embodiment, material 18 is a green, or unfired, ceramic material available in several different thicknesses and held together through conventional binders (not shown), as for example, organic binders.

For convenience, sheets 12, 14, and 16 have the same thickness, but nothing requires equal thicknesses. In the preferred embodiment, sheets 12, 14, and 16 each have a thickness of around four mils, so that the combined thickness of green sheets 12, 14, and 16 is around twelve mils. Generally speaking, the thicknesses of sheets 12, 14, and 16 are chosen so that the combined thickness is as thin as possible while still meeting strength goals with respect to the substrate upon which circuit board 10 is built. While the present invention may be practiced with any thickness of sheets 12, 14, and 16 it is preferred that the thickness be within the range of 1 to 5 mils.

FIG. 2 shows an array 20 of circuit boards 10 that will eventually be formed together in a common processing batch in accordance with the processing stages described herein. Each of sheets 12, 14, and 16 is approximately the same size as the others and large enough to accommodate the entirety of array 20. In the preferred embodiment, array 20 is around two inches by two inches, but this size will vary from application to application. FIG. 3 shows a bottom view of an exemplary form of a single circuit board 10 from array 20. Circuit board 10 as depicted in FIG. 3 may be useful in forming a chip carrier. However, those skilled in the art will appreciate that the present invention may be used in connection with any type of circuit board which is formed using an insulating substrate having conductive traces on more than one plane thereof.

With reference back to FIG. 1, sheets 22 and 24 are made from a non-stick material, such as Mylar, relative to green ceramic 18. Sheets 22 and 24 are approximately the same size as sheets 12, 14, and 16. The first stage of the process is complete after green ceramic sheets 12, 14, and 16 and non-stick sheets 22 and 24 have been fabricated.

FIG. 4 illustrates a second stage in the process of forming circuit board 10. The second stage forms holes 26a in sheets 12 and 14, and forms holes 26b in sheets 16, 22, and 24. In the preferred embodiment, holes 26 are punched through sheets 12, 14, 16, 22, and 24 by a computerized punch. A common pattern is used in forming holes 26 in layers 12, 14, 16, 22, and 24. FIG. 3 illustrates a pattern which consists of sixteen holes 26. The same spatial relationships which exist between holes 26 on one of sheets 12, 14, 16, 22, and 24 exist for each of sheets 12, 14, 16, 22, and 24. In fact, nothing prevents the punching of holes 26a through layers 12 and 14 in one operation and punching holes 26b through layers 16, 22, and 24 in another operation. Preferably, holes 26 for each of circuits 10 within array 20 (see FIG. 2) are punched in this second stage. Thousands of holes 26 may be punched for the entire array 20.

Holes 26 are dimensioned to achieve particular aspect ratio goals with respect to material 18. The aspect ratio for each of sheets, or layers, 12, 14, and 16 is calculated by dividing the thickness of the layer by the diameter of the hole 26. Holes 26 are dimensioned so that an aspect ratio of less than approximately 1:1 is maintained for each of sheets 12, 14, and 16. Moreover, the diameters and cross sectional areas of holes 26a are larger than the corresponding diameters and cross sectional areas of holes 26b. In addition, holes 26 are dimensioned so that the aspect ratio of holes 26a with respect to the combined thicknesses of sheets 12, 14, and 16 is greater than 1:1.

As discussed above, strength requirements for the substrate upon which circuit board 10 is formed dictate the thicknesses for sheets 12, 14, and 16. Thus, the diameters of holes 26a and 26b are chosen to achieve aspect ratio goals. By way of example, when each of green ceramic sheets 12, 14, and 16 are around four mils thick, holes 26a may desirably be around six mils in diameter and holes 26b may be around four mils in diameter. The resulting aspect ratios for layers 12 and 14 are each 4/6, or 0.667. The resulting aspect ratio for layer 16 is 4/4, or 1.000. The combined aspect ratio for the combination of layers 12, 14, and 16 is 12/6, or 2.000.

By keeping the combined aspect ratio at greater than 1:1, the amount of area consumed on the surfaces of the substrate upon which circuit board 10 is formed is reduced, and the overall area consumed by circuit board 10 may be reduced accordingly. By keeping the individual aspect ratios for each of sheets 12, 14, and 16 at 1:1 or less, complete and uniform coverage of metallization within vias may be achieved, as is discussed below.

The precise diameter of holes 26b through layers 22 and 24 is believed to be relatively unimportant, so long as such holes 26b have smaller diameters than holes 26a. Holes 26b through layers 22 and 24 are dimensioned equal to holes 26b through layer 16 for convenience.

Hole walls 28a surround holes 26a in sheets 12 and 14. Hole walls 28b surround holes 26b in sheet 16. The presently preferred embodiments of the present invention contemplate the use of holes 26 which have a circular cross sectional area. However, this particular geometry is not necessary, and square, elliptical, rectangular, and other cross sectional shapes will work equally well. Those skilled in the art will appreciate that when holes 26a or 26b are formed to exhibit such alternately shaped cross sectional areas, aspect ratios cannot be defined with respect to a diameter. In these situations, a maximal distance between hole walls 28 may be used in place of the diameter to calculate aspect ratios. The maximal distance represents the maximum distance across a hole 26 between any opposing walls which make up hole walls 28 in a common hole 26. Thus, the maximal distance for a circle is its diameter, the maximal distance for a square is the length of one side of the square, and the maximal distance of a rectangle is the length of the longest side of the rectangle.

Figure 5:
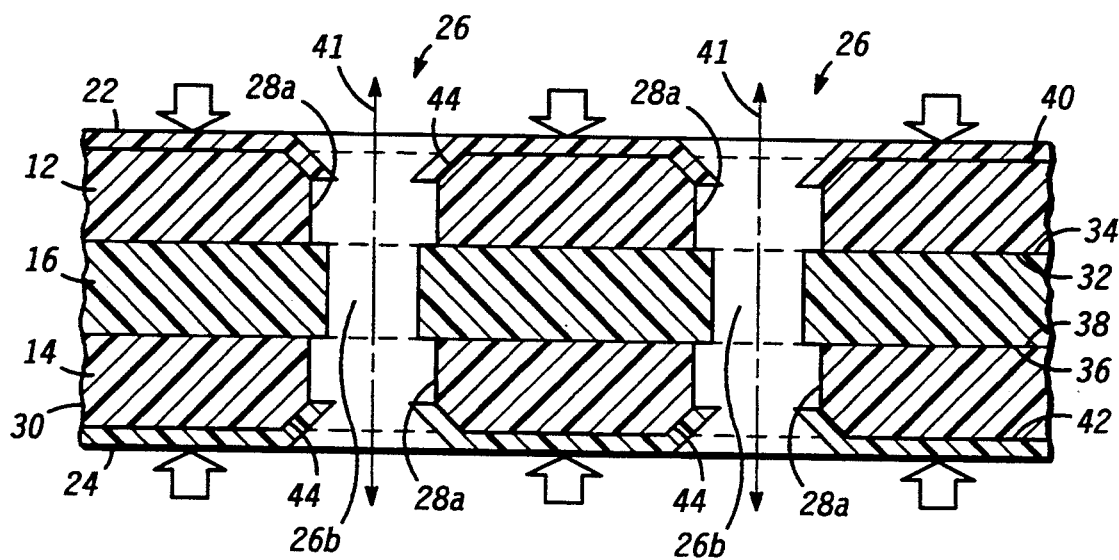
FIG. 5 shows a cross sectional side view of a portion of the various layers after a third stage.

FIG. 5 shows a cross sectional side view of a portion of circuit board 10 after a third stage in the formation process. In this third stage, sheets 12, 14, and 16 are pressed or laminated together to form an integral substrate unit 30. Prior to pressing, sheets 12, 14, and 16 are juxtaposed so that a bottom side 32 of sheet 12 contacts a top side 34 of sheet 16, and a bottom side 36 of sheet 16 contacts a top side 38 of sheet 14. Non-stick sheets 22 and 24 are placed next to top and bottom sides 40 and 42, respectively, of sheets 12 and 14.

In addition, sheets 12, 14, 16, 22, and 24 are aligned so that holes 26 therein are substantially aligned across the entire hole pattern. When thousands of holes 26 are formed in each of sheets 12, 14, 16, 22, and 24 across array 20 (see FIG. 2), each hole 26 in one of sheets 12, 14, 16, 22, and 24 is substantially aligned with corresponding holes in the other ones of layers 12, 14, 16, 22, and 24. As a result of this alignment, the centers of corresponding holes 26 are positioned along common lines, such as dotted lines 41 shown in FIG. 5. Moreover, stepped openings result, wherein the central region of each opening, which is formed by hole 26b in layer 16, has a smaller cross sectional area and a smaller diameter than the exterior regions of the opening.

After the alignment, sheets 12, 14, 16, 22, and 24 are pressed together in a conventional press (not shown) to form laminated substrate 30. Compression pressures of around 3000 psi, or any other pressure suitable for laminating material 18, may desirably by applied to sheets 12, 14, 16, 22, and 24. This pressure apparently causes non-stick sheets 22 and 24 in the vicinity of holes 26b therein to deform inward. Such inward deformation forms bevelled edges 44 in layers 12 and 14 where hole walls 28a therein intersect top side 40 and bottom side 42, respectively, of substrate 30. Those skilled in the art will appreciate that FIG. 5 shows the relative size of bevelled edges 44 in an exaggerated state for the purpose of clarity.

After the completion of the laminating stage depicted in FIG. 5, substrate 30 is removed from the press and sheets 22 and 24 are removed from substrate 30. Substrate 30 is then heated or fired in a kiln at a relatively low temperature. In particular, substrate 30 is first heated at a very low temperature to burn off organic binders within substrate 30. Then, the temperature is raised, and a curing temperature which is preferably less than 1200° C. and more preferably around 860° C. is maintained for a predetermined period of time. Thus, substrate 30 represents a low-temperature ceramic. The relatively low temperature firing is advantageous compared to firing at higher temperatures because less relative movement of holes 26 occurs as a result of shrinkage in material 18. The reduced movement of holes 26 leads to improved accuracy in the placement of holes 26. Those skilled in the art will appreciate that the hole dimensions and layer thickness which were discussed above shrink as a result of firing substrate 30. However, substantially the same aspect ratio goals which were discussed above in connection with FIG. 4 are maintained after firing.

FIG. 6 shows a cross sectional side view of a portion of circuit board 10 at a fourth stage in the formation of circuit 10. In this fourth stage, a conductive material is applied to substrate 30 from side 40 thereof. While any conductive material may be applied at this stage, the chip carrier embodiment of circuit board 10 discussed above desirably applies an alloy made from gold (Au) and a metal from the platinum family, such as platinum (Pt) or palladium (Pd), but other adherent conductive materials well known in the art may also be employed depending on the user's requirement.

The present invention contemplates the use of conventional metallization processes during this fourth stage. Thus, a metallic material may be applied by evaporation deposition, sputter deposition, screening, or the like. However, the above discussed alloy may be difficult to apply by evaporation or sputtering techniques, and therefore a conventional thick film screening process, as illustrated in FIG. 6, is preferred. Accordingly, a screen mask 46 is aligned over side 40, and a metallic paste 48 is forced through open areas 50 in mask 46.

Preferably, mask 46 is aligned on holes 26 in substrate 30. Since substrate 30 has already been fired, alignment errors associated with hole movement during firing are substantially eliminated. In one embodiment, mask 46 is aligned on holes 26 within a single sector 52 (see FIG. 2) of array 20. After use of the mask in this sector 52, mask 46, or a different appropriate mask, is moved to other sectors of array 20 and the alignment and metallization process repeated. By aligning mask 46 to different individual sectors 52 of array 20, alignment errors caused by hole movement over the entirety of array 20 are minimized.

With reference back to FIG. 6, paste 48 coats substrate 30 only under open areas 50 of mask 46. Desirably, mask 46 is constructed so that open areas 50 overlie holes 26 and surrounding "land" sections of top side 40 of substrate 30. Those skilled in the art will appreciate that alternate techniques of metallizing substrate 30, such as evaporation or sputtering, may apply a metallic coating over the entirety of top side 40. After such a coating, conventional photoresist applying, masking, and etching steps may be performed to remove unwanted portions of the coating. The masking step may desirably align a mask on holes 26 in particular sectors 52 (see FIG. 2) as discussed above. Moreover, those skilled in the art will appreciate that multiple layers of a conductive material may be applied in this stage. Subsequent layers may be applied by plating, or any other technique. When surfaces of circuit board 10 are to be soldered, a base layer of chromium (Cr) may be applied first, followed by layers of copper (Cu), gold (Au), and/or other materials.

This fourth stage additionally contemplates that substrate 30 and paste 48 may again be fired, at a temperature at or less than the firing temperature for substrate 30, to adhere metallization 48 to substrate 30. FIG. 7 shows a partial cross sectional side view of a portion of a circuit board 10 from array 20 after this fourth stage in the formation of circuit 10. FIG. 8 shows a partial top view after this fourth stage in the formation of circuit 10.

With reference to FIGS. 7 and 8, a conductive coating 52 overlies the portions of top side 40 of substrate 30 which surround holes 26. Conductive coating 52 remains on substrate 30 after firing metallic paste 48 (see FIG. 6). In addition, coating 52 extends into hole 26 through layers 12 and 16 of substrate 30. In particular, coating 52 overlies hole walls 28a of layer 12 and hole walls 28b of layer 16. Coating 52 also overlies the portions of side 34 which surround holes 26b of layer 16 and which are exposed through holes 26a. Due to bevelled edges 44, thinning of coating 52 at the intersection of hole walls 28a and top side 40 is reduced or eliminated, and a good electrical contact is made between a trace 54 formed from coating 52 on top side 40 of substrate 30 and a via 56 partially formed on hole walls 28a abd 28b from coating 52. Due to the individual aspect ratios for layers 12 and 16, discussed above, uniform coverage exists on hole walls 28a and 28b through layers 12 and 16, respectively.

While a certain amount of back-scattering may place some of coating 52 on hole walls 28a of layer 14 and on bottom side 36 of layer 16, particularly if coating 52 is applied by sputtering or evaporation, the present invention requires no particular coverage to occur. Thus, coating 52 need not extend further than layer 16 after the fourth stage.

Figure 9:
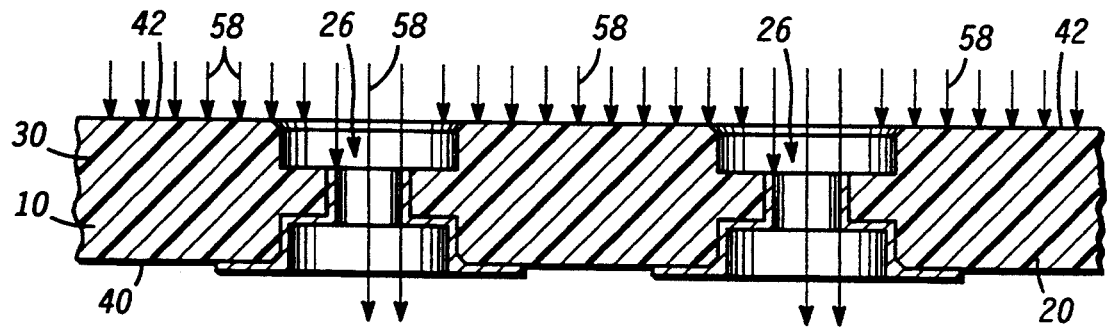
FIG. 9 shows a cross sectional side view of a portion of the circuit board at a fifth stage.

FIG. 9 shows a cross sectional side view of a portion of a circuit board 10 from array 20 at a fifth stage in the formation of array 20. In FIG.9, substrate 30 is inverted with respect to FIG. 7. During this fifth stage, a conductive material 58 is applied to substrate 30 from bottom side 42 thereof. FIG. 9 depicts bottom side 42 facing upward, rather than top side 40 as was depicted facing upward in FIGS. 6-8. Conductive material 58 may, but need not, be the same material applied during the fourth stage. In fact, in the connection with the chip carrier depicted in FIGS. 2 and 3, conductive material 58 is made substantially from gold (Au) rather than the alloy discussed above. In this embodiment, gold is screen-applied to a thickness of around seven microns over the entirety of bottom side 42 of substrate 30. However, those skilled in the art will appreciate that other metallization processes may be utilized as well. This metallization stage causes conductive material 58 to enter hole 26 from side 42 and coat hole walls 26a of layer 14, bottom side 36 of layer 16, and hole walls 26b of layer 16. After application of metallization, circuit board 10 may again be fired to sinter material 58 to substrate 30.

Figure 10:
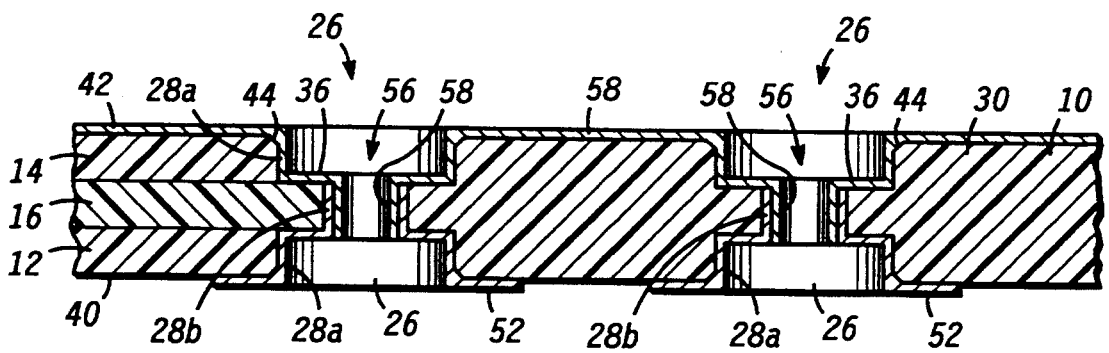
FIG. 10 shows a cross sectional side view of a portion of the circuit board after the fifth stage.

FIG. 10 shows a cross sectional side view of a portion of a circuit board 10 of array 20 after the fifth stage in the formation process. Conductive coating 58 overlies the entire bottom side 42 of substrate 30 but this is not essential. FIG. 10 also depicts bottom side 42 of substrate 30 facing upward. Coating 58 also extends into hole 26 through layers 14 and 16 of substrate 30. In particular, coating 58 overlies hole walls 28a of layer 14 and hole walls 28b of layer 16. At hole walls 28b, coating 58 also overlies coating 52 applied in the above-discussed fourth stage. Thus, a double metallization coating occurs in the center of the barrel of via 56. This double metallization in hole 26b in central layer 16 insures that there is little or no thinning of the metallization in that portion of via 56. Coating 58 also overlies the portions of bottom side 36 of layer 16 which surround holes 26b of layer 16 and which are exposed through holes 26a in layer 14. Due to bevelled edges 44, no thinning of coating 58 occurs at the intersection of hole walls 28a and bottom side 42 of substrate 30, and a good electrical contact is made between coating 58 on bottom side 42 and coating 58 in via 56. Due to the individual aspect ratios for layers 14 and 16, discussed above, uniform coverage exists on hole walls 28a and 28b through layers 14 and 16, respectively.

After the fifth stage depicted in FIG. 10, bottom side 42 of substrate 30 and coating 58 thereon (if continuous) may be patterned and etched using conventional techniques (not shown). Those skilled in the art will appreciate that patterning and etching may be carried out on ceramic surfaces with excellent accuracy. Moreover, any masking required by the patterning process may be aligned to holes 26, which have already moved due to prior firings of substrate 30, as described above. Alignment errors caused by firing substrate 30 are substantially eliminated. Regardless of the particular processing applied to coating 58 over bottom side 42 of substrate 30, vias 56 have been formed in circuit board 10. Vias 56 provide continuous conductive paths through substrate 30 between top and bottom sides 40 and 42.

Moreover, vias 56 may be visually inspected at this point. Conductive coatings on hole walls 28a in layers 12 and 16 are easily viewed because they reside near the exterior surfaces of substrate 30. Likewise, conductive coatings on top and bottom sides 34 and 36, respectively, of layer 16 are easily viewed because they extend perpendicular to direct viewing angles. Conductive coatings on hole walls 28b in the center of vias 56 are also easily viewed. They may be easily viewed because they extend for only a short distance and because viewing angles are enlarged due to wider holes 26a located on either side of holes 26b.

Figure 11:
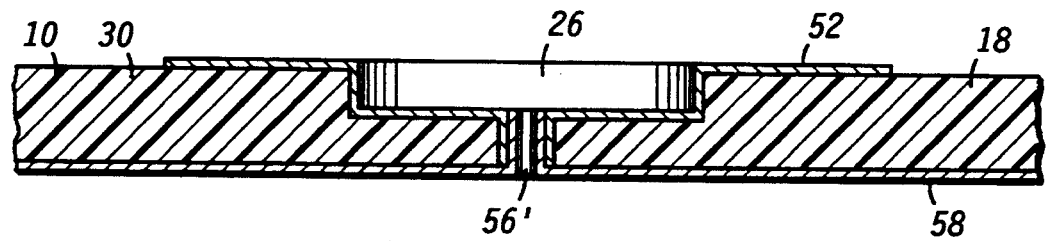
FIG. 11 shows a partial cross sectional side view of an alternate embodiment of the circuit board.

While the above discussed embodiments of the present invention have shown substrate 30 as having three distinct layers, other adaptations of stepped vias 56 may be devised as well. For example, FIG. 11 illustrates a stepped via 56' which is constructed in substantially the same manner as described above, except that only two layers of material 18 are used. The aspect ratios of holes in each individual layer is desirably less than 1:1, but the combined aspect ratio at holes through at least one of the two layers is greater than 1:1.

Further, while the means and method of the present invention have been described, for convenience of explanation, in terms of ceramic materials for layers 12, 14, 16, those of skill in the art will understand based on the description herein that other insulating materials (e.g. plastic impregnated materials, glasses, etc.) may also be used and bonded together using methods available for such materials.

In summary, the present invention provides an improved means and method for circuit board boards with electrical continuity between surfaces. The electrical continuity is provided by stepped vias, which form reliable and inspectable conductive feedthroughs at combined aspect ratios of greater than 1:1. For a substrate of a given thickness, this results in smaller diameter via holes. The smaller diameter via holes result in electrical circuits that can be implemented in less area. The present invention may be practiced on substrates which are around fifteen mils thick or less and which have via holes less than fifteen mils in diameter. Moreover, thick film processing techniques, such as screen printing, may be utilized to metallize the substrate so that a wide choice in metallurgy may be adapted to the present invention and expenses may be minimized.

The present invention has been described above with reference to preferred embodiments. However, those skilled in the art will recognize that changes and modifications may be made in these preferred embodiments without departing from the scope of the present invention. For example, numerous diverse materials may be utilized for substrates and conductive coatings. Moreover, the present invention may be practiced on a wide range of processing scales, utilizing either thin film or thick film processing techniques, and the present invention may be practiced on three dimensional circuit boards having any number of diverse planes within which conductors may be routed. These and other changes and modifications which are obvious to those skilled in the art are intended to be included within the scope of the present invention.

What is claimed is:

1. A single layer circuit board with stepped vias and electrical continuity between outer surfaces comprising:
an insulating substrate having first and second outer opposite surfaces and having a thickness equal to the distance between said first and second opposite surfaces, said substrate having an aperture extending therethrough between said first and second outer opposite surfaces, said thickness being greater than a maximal distance across said aperture, said aperture having:
a first cross sectional area in a first region of said substrate said first region being adjacent to said first outer surface of said insulating substrate;
a second cross sectional area in a second region of said substrate said second region being adjacent to said second opposite surface of said insulating substrate; and
a third cross sectional area in a third region of said substrate, said third region located between said first and second regions of said aperture, said third cross sectional area being less than said first and second cross sectional areas;
a first conductive layer of a conductive material extending through said first and third regions of said substrate; and
a second conductive layer of said conductive material extending through said second and third regions of said substrate, said first and second conductive layers partially overlapping in said third region, said first and second conductive layers forming a substantially continuous coating between said first and second opposite surfaces.

2. A single layer circuit board as claimed in claim 1 wherein said insulating substrate comprises:
a first insulating sheet having a first hole of said first cross sectional area extending therethrough;
a second insulating sheet having a second hole of said second cross sectional area extending therethrough; and
a third insulating sheet disposed between said first and said second insulating sheets, said third sheet having a third hole of said third cross sectional area extending therethrough, said third hole substantially aligned with said first and said second holes, said first, second and third sheets bonded together to form said insulating substrate, said first, second and third holes forming said aperture and said first conductive layer extending through said first and third holes, said second conductive layer extending through said second and third holes.

3. A single layer circuit board as claimed in claim 2 wherein said first insulating sheet exhibits a first thickness, and said second insulating sheet exhibits a second thickness and said third insulating sheet exhibits a third thickness, each of said first second and third thickness is between approximately 0.001 and 0.005 inch.

4. A single layer circuit board as claimed in claim 1 wherein a maximal distance across said aperture in said third region is approximately two-thirds a maximal distance across said aperture in said first or said second regions.

5. A single layer circuit board as claimed in claim 2 wherein:
said third sheet has first and second opposite sides, said first side of said third sheet in contact with a second side of said first sheet, said second side of said third sheet in contact with a first side of said second sheet;
said first, second and third holes are surrounded by first second, and third hole walls, respectively; and
said conductive material comprises a metallic coating, and said first conductive layer resides on said first hole walls, on said first side of said third sheet surrounding said third hole and said third hole walls, said second conductive layer resides on said second hole walls, on said second side of said third sheet surrounding said third hole, on said third hole walls.

6. A single layer circuit board as claimed in claim 2 wherein said first second and third insulating sheets are made from a ceramic and are laminated into an integral unit to form said insulating substrate.

7. A single layer circuit board as claimed in claim 7 wherein said first second and third insulating sheets are laminated into said integral unit by pressing said sheets together at approximately 3000 psi and fired at a firing temperature of less than 1200 degrees Celsius to limit the relative movement of said holes.

8. A single layer circuit board as claimed in claim 2 wherein:
said first hole is one of a plurality of first holes extending through said first sheet, each hole of said plurality of first holes having a cross sectional area substantially similar to said cross sectional area of said first hole;
said second hole is one of a plurality of second holes extending through said second sheet, each hole of said plurality of second holes having a cross sectional area substantially similar to said cross sectional area of said second hole;
said third hole is one of a plurality of third holes extending through said third sheet, each hole of said plurality of third holes having a cross sectional area substantially similar to said cross sectional area of said third hole;
each hole of said plurality of said first, second and third holes are mutually positioned so that each third hole is substantially aligned with a corresponding one of said first and second holes; and
said circuit additionally comprises a plurality of second conductive materials, each of said second conductive materials extending through corresponding ones of said first, second and third holes.

9. A single layer circuit board as claimed in claim 1 wherein:
said first outer opposite surface of said insulating substrate is beveled toward said second outer opposite surface of said insulating substrate proximate to an intersection with said aperture.

10. A single layer circuit board as claimed in claim 1 additionally comprising a second conductive coating residing on said first opposite surface of said insulating substrate surrounding said aperture, said second conductive coating being in electrical contact with said continuous coating through said first, second and third regions of said aperture.

11. A single layer circuit board as claimed in claim 1 wherein:
said thickness of said insulating substrate is between approximately 0.003 and 0.015 inch thick; and
said maximal distance across said aperture is less than said thickness.

12. A single layer circuit member with stepped vias and electrical continuity between surfaces comprising:
a first insulating substrate sheet having first and second sides and a plurality of first holes extending between said first and second sides of said first sheet and forming a predetermined pattern relative to one another, said first holes approximately exhibiting first maximal distances between opposed faces thereof;

a second insulating substrate sheet having first and second sides and a plurality of second holes extending between said first and second sides of said second sheet in said predetermined pattern, said second holes approximately exhibiting second maximal distances between opposed faces thereof, said second maximal distances being smaller than said first maximal distances;

a third insulating substrate sheet having first and second sides and a plurality of third holes extending between said first and second sides of said third sheet in said predetermined pattern, said third holes approximately exhibiting third maximal distances between opposed faces thereof, said third maximal distances being greater than said second maximal distances, said second side of said first sheet being juxtaposed with said first side of said second sheet and said second side of said second sheet being juxtaposed with said first side of said third sheet so that corresponding ones of said first, second, and third holes are aligned said first, second and third insulating substrate sheets forming an integral unit;

a first substantially continuous conductive coating extending through said first hole and at least a portion of said third hole; and a second substantially continuous conductive coating extending through said second hole and at least a portion of said third hole, said first and second substantially continuous conductive coatings at least partially overlapping and providing continuity between said first side of said first sheet and said second side of said third sheet.

13. A single layer circuit member as claimed in claim 12 wherein:

said first sheet exhibits a first thickness between said first and second sides thereof, said second sheet exhibits a second thickness between said first and second sides thereof, and said third sheet exhibits a third thickness between said first and second sides thereof; and the ratio of said first thickness divided by said first maximal distance is less than one, the ratio of said second thickness divided by said second maximal distance is less than one, and the ratio of said third thickness divided by said third maximal distance is less than one.

14. A single layer circuit member as claimed in claim 13 wherein:

said first thickness plus said second thickness plus said third thickness equals a combined thickness; and the ratio of said combined thickness divided by one of said first and third maximal distances is greater than one.

15. A single layer circuit member as claimed in claim 14 wherein:

each of said first and second and third substrate sheets is between approximately 0.001 and 0.005 inch thick between said first and second sides thereof; and said first and third maximal distances are each less than approximately 0.010 inch.

16. A multi-layer circuit board comprised of a plurality of single layer circuit boards with stepped vias and electrical continuity between surfaces, said single layer circuit boards being combined into an integral unit, each of said single layer circuit boards comprising:

an insulating substrate having first and second opposite surfaces and having a thickness equal to the distance between said first and second opposite surfaces, said substrate having an aperture extending therethrough between said first and second opposite surfaces, said thickness being greater than a maximal distance across said aperture, said aperture having:

a first cross sectional area in a first region of said substrate;

a second cross sectional area in a second region of said substrate; and a third cross sectional area in a third region of said substrate, said third region located between said first and second regions of said aperture, said third cross sectional area being less than said first and second cross sectional areas; and a conductive material extending through said aperture forming a substantially continuous coating between said first and second opposite surfaces.

* * * * *